United States Patent [19]
Kainuma

[11] Patent Number: 5,392,711
[45] Date of Patent: Feb. 28, 1995

[54] METHOD OF MANUFACTURING A PRINTING PLATE

[75] Inventor: Takashi Kainuma, Nagoya, Japan

[73] Assignee: Kaitec Co., Ltd., Nagoya, Japan

[21] Appl. No.: 131,399

[22] Filed: Oct. 5, 1993

[30] Foreign Application Priority Data

Oct. 16, 1992 [JP] Japan .................................. 4-304805
Oct. 26, 1992 [JP] Japan .................................. 4-311410
Dec. 1, 1992 [JP] Japan .................................. 4-349725

[51] Int. Cl.$^6$ ............................................. B41N 3/03
[52] U.S. Cl. ................................. 101/401.1; 430/300
[58] Field of Search ............... 101/327, 333, 401.1, 101/170, 486; 430/300, 302, 307; 156/905

[56] References Cited

U.S. PATENT DOCUMENTS

| | | | |
|---|---|---|---|
| 2,210,923 | 8/1940 | Jacquerod et al. | 101/401.1 |
| 2,215,128 | 9/1940 | Meulendyke | 101/401.1 |
| 3,325,285 | 6/1967 | Harris et al. | 430/307 |
| 3,342,911 | 9/1967 | Funahashi | 101/327 |
| 3,575,109 | 4/1971 | Wall | 101/401.1 |
| 3,678,848 | 7/1972 | Roser et al. | 101/327 |
| 3,855,925 | 12/1974 | Funahashi | 101/333 |
| 3,913,477 | 10/1975 | Howland et al. | 430/307 |
| 4,986,175 | 1/1991 | Boehringer et al. | 101/327 |
| 5,164,285 | 11/1992 | Takakura | 101/401.1 |
| 5,228,387 | 7/1993 | Siculan | 101/333 |

FOREIGN PATENT DOCUMENTS

| | | | |
|---|---|---|---|
| 0217385 | 12/1983 | Japan | 101/401.1 |
| 0217386 | 12/1983 | Japan | 101/401.1 |
| 0280936 | 12/1986 | Japan | 101/401.1 |

*Primary Examiner*—Ren Yan

[57] ABSTRACT

The method which comprises the steps of producing a halftone dot photograph, producing a cut out photograph by cutting out a desired portion of the photograph, adhering the cut out photograph on a transparent film, printing the front side of this film on a positive film to produce a halftone positive film, printing the backside of said film on a negative film to produce a silhouette film in which the cut out portion appears as deep-black, superposing the halftone positive film on a photosensitive resin plate to produce a photographic resin plate, turning the silhouette film upside down and superposing it on the photosensitive resin plate and exposing it to light to produce a silhouette resin plate, alternately bringing the photographic resin plate and silhouette resin plate into contact with a continuous foaming resin plate.

1 Claim, 6 Drawing Sheets

FIG. 1
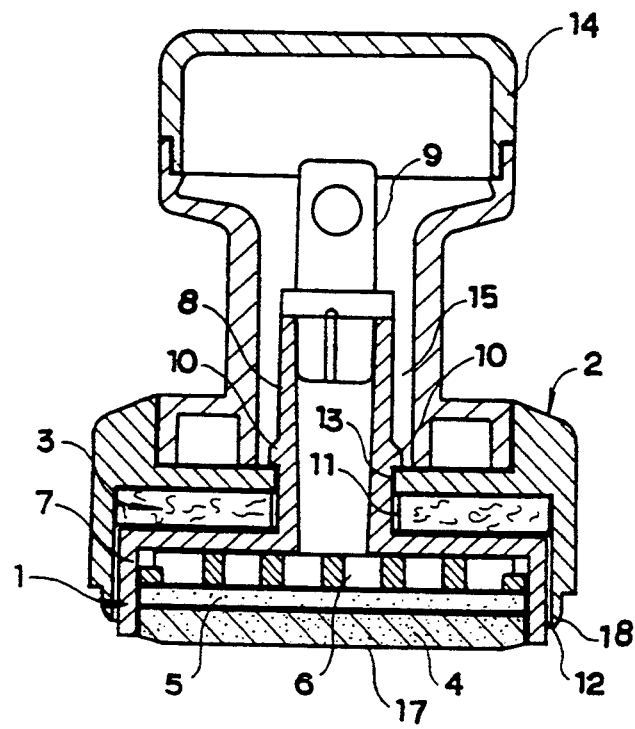
FIG. 2
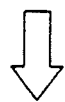
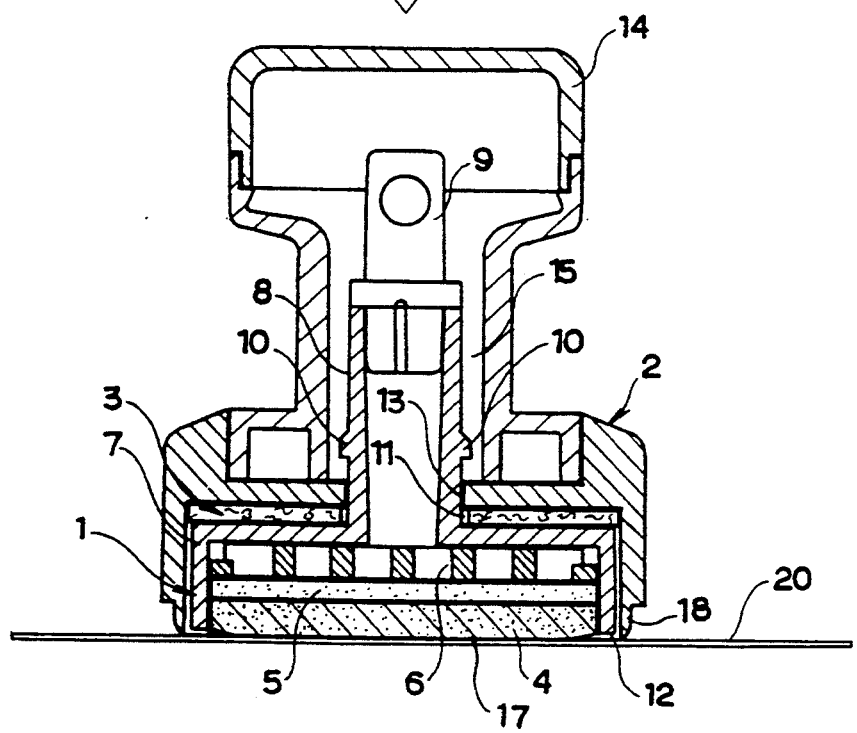

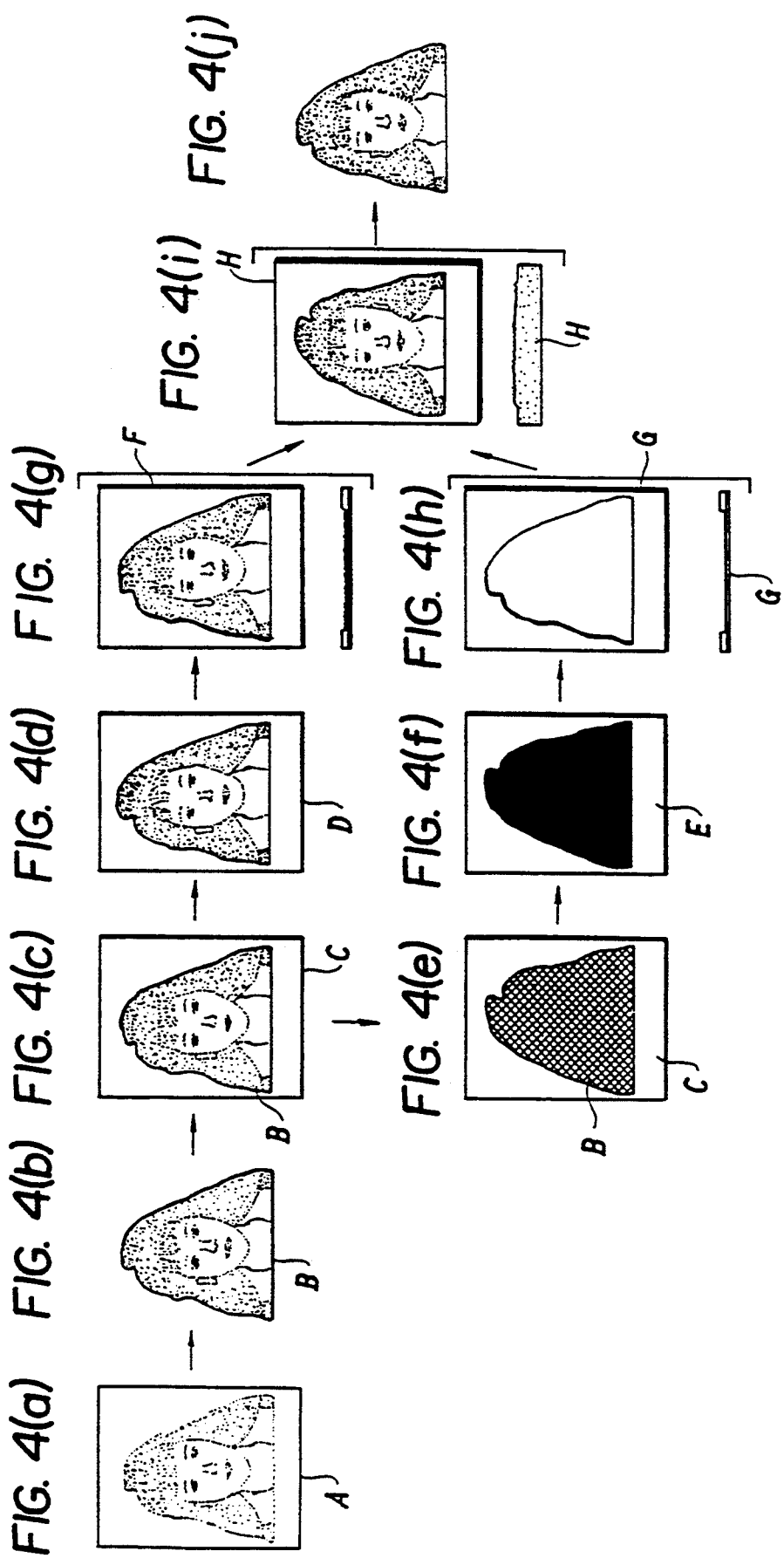

METHOD OF MANUFACTURING A PRINTING PLATE

BACKGROUND OF THE INVENTION

The present invention relates to an ink permeation type stamp capable of stamping a photograph, a letter, or a precision picture or pattern, and more particularly to a stamp comprising a printing member made of continuous foaming resin print plate capable of permeating ink onto a print surface from a back ink reservoir, a case with handle having an opening on its front surface which is exposed to the print surface, and an elastic mat, whereby the elastic mat is laid on an inner bottom of the case and the printing member stored in the case is energized by elasticity to project the print surface from an edge of the opening of the case.

Generally, a print of a seal made of plastics and the like which stamps using a red seal-ink tends to be indistinct depending on the amount of adhered red seal-ink or pressure applied in the stamping, and also, the wrist becomes fatigued by the hard abutment of the seal on the paper due to lack of elasticity, which are drawbacks.

On the other hand, the ink permeation type stamp that allows the permeation of ink from the ink reservoir onto the print surface has heretofore been known as a seal requiring no red seal-ink.

The conventional stamp was constructed in such a way that a required print of seal was formed on the surface of a foaming resin plate (known as porous rubber or sponge) by unevenness which foamed olefin resin or resin of vinyl chloride so that bubbles (10–40microns) continued, and non-dry type ink permeated the foaming resin plate thereby requiring no red seal-ink when using.

However, the conventional stamp fails to display small lines or dots which resulted in the inability of printing small letters (particularly, Ming-style type) beautifully, and a display of stamping of delicate lines like bar code or photography requiring a halftone was only remotely possible.

Furthermore, the conventional stamp had a problem of not producing a distinct print of seal unless the stamp was lowered on the print surface perpendicularly and uniform pressure was applied thereto.

Also, in order to obtain a precise print of seal, the print surface and the paper surface were required to be in contact with uniform pressure as an indispensable means, but the problem was how to keep a uniform pressure when applying it by hand.

SUMMARY OF THE INVENTION

An object of this invention is to provide a stamp in which a print surface projects from an edge of an opening of a case by elasticity of an elastic mat whereby the print surface and the paper surface come always into contact smoothly with a uniform pressure, and as a result, a beautiful print of seal is always produced which is free from an indistinct print of seal due to an excess or lack of pressure.

Another object of this invention is to provide a print plate made of continuous foaming resin plate capable of permeating an ink from a back ink reservoir, whereby required portions of the foaming resin plate are hot sealed precisely to display a delicate picture, pattern, photograph, letter and the like, and moreover, its background may be finished beautifully, and the range of utilization of stamp is enlarged.

BRIEF DESCRIPTION OF THE DRAWINGS

In the accompanying drawings:

FIG. 1 is a vertical section view of a stamp according to the present invention;

FIG. 2 is a drawing showing an operating condition of FIG. 1;

FIGS. 4(a)–4(j) illustrate the sequence of products that would result during stages (a) thru (j) of my process.

DESCRIPTION OF THE PREFERRED EMBODIMENT

Figure 3:
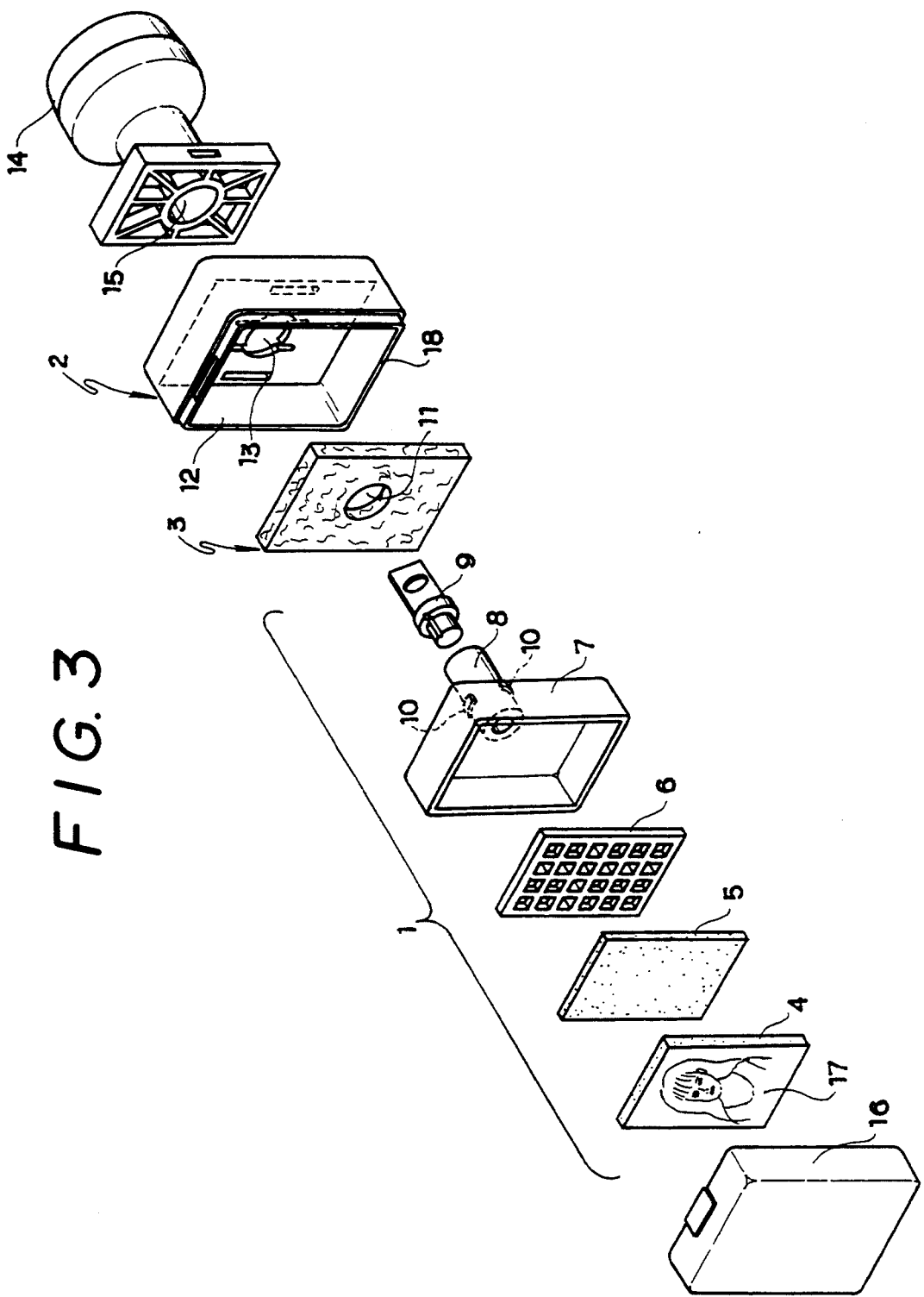
FIG. 3 is an exploded perspective view of a stamp according to the present invention.

The stamp according to the present invention is composed of a printing member 1, a case with handle 2, and an elastic mat 3. The printing member 1 is constructed in such a way that a fiber layer 5 for permeation of ink, and a lattice type spacer 6 are disposed on the back surface of an ink permeable print plate 4 made of continuous foaming resin plate such as an olefin resin, and the ink permeation fiber layer 5 and the lattice type spacer 6 are accommodated in an ink box 7, and the print plate 4 is thermally fused to the front surface of the ink box 7.

Reference numeral 8 denotes a cylinder portion formed integrally with the back surface of the ink box 7, and ink is filled up in the ink box 7 from the cylinder portion 8. By the way, numeral 9 denotes a plug to be fitted on the tip of the cylinder portion 8. A wedge type engaging portion 10 to be described hereinafter projects on an outer periphery of the cylinder portion 8.

Also, the elastic mat 3 is constructed in such a way that a sponge of a fixed thickness is punched out in a rectangular form, and a through hole 11 that penetrates the cylinder portion 8 is bored in its center.

Furthermore, the case 2 is shaped in a rectangular box form and has an opening 12 at its front surface, and the ink box 7 is housed in the case 2 to move back and forth, and the cylinder portion 8 and the plug 9 project on the back surface after penetrating an engaging hole 13 bored in the center of the case 2. By the way, a notch 19 is formed at a position corresponding to a peripheral portion of the engaging hole 13, and a resiliency is applied to the peripheral edge bordering on the notch 19 of the engaging hole 13.

Numeral 14 denotes a handle of mushroom type fixed integrally to the back surface of the case 2, and an axial hole 15 to which the cylinder portion 8 and the plug 9 can advance is formed in the center of the handle 14. Numeral 16 denotes a cap capable of engaging an edge 18 of an opening of the case to protect the print surface of the print plate 4.

This stamp as shown in FIG. 1 is assembled in such a way that the elastic mat 3 is laid on the inner bottom of the case 2, and the elastic mat 3 is positioned on the back surface of the ink box 7 and the cylinder portion 8 is penetrated into the engaging hole 13 by compressing the elastic mat 3 by the back surface of the ink box 7 to engage the engaging portion 10 on the outer periphery of the cylinder portion 8 with the peripheral edge of the engaging hole 13 by the resiliency provided by the notch 19, and the print surface 17 projects slightly from the edge 18 of the opening of the case 2 by energizing the printing member 1 forward by the elasticity of the elastic mat 3.

The printing member 1 is retracted into the case 2 by resisting the elasticity of the elastic mat 3 by the reaction force received from the paper surface 20 when the print surface is urged against the paper surface 20 by holding the handle 14, and as shown in FIG. 2, the edge 18 of the opening abuts on the paper surface 20. From the foregoing, the print surface 17 is urged against the paper surface 20 by only the elasticity of the elastic mat 3, and the load is received by the edge 18 of the opening even though an unbalanced load is applied to the handle 14 whereby the print surface 17 is urged against the paper surface 20 softly by uniform pressure constantly by the elasticity of the elastic mat 3. By the way, the engaging portion 10 prevents the printing member 1 from falling out of the case 2.

Next, the method of manufacturing the print plate 4 will be described by referring to FIG. 4 through FIG. 7.

This embodiment allows a stamping of a name on a portrait.

In the first place, a halftone dot photograph A showing a shade with sizes of halftone dots as shown in FIG. 4(a) is produced by printing with halftone dots after reading the portrait with a scanner. A required display portion of a person in the halftone dot photograph A is cut out (b) to produce a cut out photograph B.

Next, this cut out photograph B is pasted to a transparent film C as shown in (c) by means of an adhesive, and this photograph is printed on a positive film to produce the halftone positive film D shown in (d).

On the other hand, the transparent film C on which the cut out photograph B is pasted is reversed as shown in (e), and this film is printed on a negative film to produce a silhouette film E as shown in (f) in which the cut out portion becomes deep-black.

And then, the halftone positive film D is superposed on a photosensitive resin plate to be exposed to light to produce a photographic resin plate F as shown in (g) in which the transparent portion of the halftone positive film D becomes the convex portion. Also, the silhouette film E is folded and is superposed on a photosensitive resin plate to be exposed to light to produce a silhouette resin plate G as shown in (h) in which its transparent portion becomes the convex portion. By the way, the photosensitive resin plate is produced in such a way that a photosensitive resin is formed on a metal plate in a certain thickness as the photographic resin plate F and the silhouette resin plate G are shown in cross section.

Next, a foaming resin plate H as shown in FIG. 4(i) will be manufactured by using a manufacturing device whose structure will be described hereinafter with the use of the photographic resin plate F and the silhouette resin plate G. An explanation of the structure of the manufacturing device will be provided referring to FIG. 6 and FIG. 7.

In this device, a mounting plate 102 is supported on a base plate 101 horizotally, and a fulcrum 103 is erected in the center portion of the mounting plate 102, and a mounting plate 105 is horizontally supported by means of a guide cylinder 104 so that it becomes vertically liftable along the fulcrum 103, and a rack 106 is suspended on the lower surface of the mounting plate 105 and a worm 107 meshed with the rack 106 is supported on a bearing 108 fixed to the mounting plate 102. A handle shaft 111 is connected to a lower end of the worm 7 by means of a pair of bevel gears 109 and 110, and the handle shaft 111 is horizontally supported by bearings 112 and 113, and a handle 114 is provided at a tip of the handle shaft 111. When the handle 114 is rotated, the height of the mounting plate 105 is finely adjusted.

The mounting plate 105 is made of a material having high thermal conductivity such as aluminum and the like, and a heater 115 and a temperature thermostat 116 are provided in its inside. A magnet plate 117 is interposed on the mounting plate 105, and the photographic resin plate F may be fixed detachably by its magnetic desorption.

At both sides of the mounting plate 105, guide rails 119 are provided, and a travel member 120 is provided to slide on the guide rail 119 by means of a shoe 131. Numeral 121 denotes a ball screw provided at one side of the travel member 120, and a motor 123 for drive is provided at one end of a screw shaft 122 of the ball screw 121, and the screw shaft 122 is rotated by the drive of the drive motor 123 and the travel member 120 travels on the guide rail 119.

Also, numeral 124 denotes a drive rail whose top is flat which is provided at one side of the mounting plate 105 so as to be in parallel to the guide rail 119.

A bearing 125 is provided on the travel member 120, and a cylindrical drum 126 and a drive wheel 127 which are integrally formed on the bearing are rotatably journalled by the bearing 125.

A pair of latches is fixed on an outer periphery of the drum 128 by means of a set screw 129, and the foaming resin plate H is detachably wound on the drum by sandwiching both end portions by means of the latches 128. The foaming resin plate H is a flexible plate which forms a continuous bubble capable of permeating with ink when the olefin resin is foamed.

The drive wheel 127 is so formed that its outer periphery becomes almost equal to that of the foaming resin plate H wound on the drum 126, and the outer periphery of the drive wheel 127 is arranged to be urged against the upper surface of the drive rail 124.

In this device, the photographic resin plate F is fixed onto the mounting plate 105, and the height of the mounting plate 105 is finely adjusted by the handle 114, and the convex portion of the photographic resin plate F is set to a height so that it gets into the surface of the foaming resin plate H by about 0.1–0.3 mm, and the surface of the photographic resin plate F is uniformly heated by means of the heater 115 so that its temperature reaches about 100–130 degrees centigrade.

The travel member 120 is caused to travel in one direction of the guide rail 119 by the drive motor 123 through the ball screw 121, and the drum 126 is rotated by rotating the drive wheel 127 that keeps contact with the top of the drive rail 124, and the foaming resin plate H wound on the outer periphery of the drum 126 is urged against the surface of the photographic resin plate F while the line contact portion sequentially shifts from its one end. The hot sealing is accomplished by melting the surface of the foaming resin plate H in contact with the convex portion of the surface of the photographic resin plate F with its heat and sealing the bubbles.

The surface of the foaming resin plate H in contact with the convex portion of the photographic resin plate F makes the ink difficult to permeate, and the ink comes out only from the portion opposed to the concave portion of the photographic resin plate F.

And then, the photographic resin plate F on the magnet plate 117 is replaced with the silhouette resin plate G, and the silhouette resin plate G is uniformly heated, and similar to the foregoing, the travel member 120 is caused to travel, and the drum 126 is rotated and the silhouette resin plate G is urged against the surface of the foaming resin plate H, and the convex portion (background portion of the portrait) of the silhouette resin plate G is caused to contact the background portion of the foaming resin plate H, and the background portion of the foaming resin plate H is hot sealed without any permeation.

The resulting foaming resin plate H is wound on the outer periphery of the drum 126, and the drum 126 is rotated by the drive wheel 127 whose diameter is almost equal to an outside diameter of the foaming resin plate H so that when the height of the mounting plate 105 is finely adjusted, the photographic resin plate F and the silhouette resin plate G do not shift sideways on the surface of the foaming resin plate H which keeps the contact, and the required portion is hot sealed precisely, whereby if the print plate 4 is housed in the ink box 7 and a non-drying ink is allowed to permeate by the fiber layer for ink permeation, the ink permeates from the portion other than the hot seal portion of the surface of the print plate 4 and the shade of the photograph may be displayed by the size of the halftone by the stamping as shown in FIG. 4(j), and the print seal representing beautifully including the halftone may be obtained. The display free of stain may be obtained since the heat sealing of the background portion is carried out beautifully by the silhouette resin plate G.

Figure 5A:
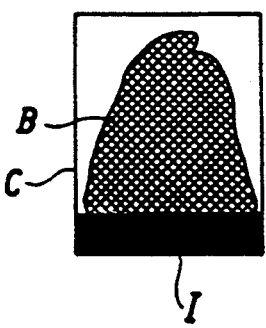
FIGS. 5(a)–5(c) illustrate the sequence of products (a), (b) and (c) that would result when carrying out an alternative embodiment of the process of my invention.
Figure 5B:
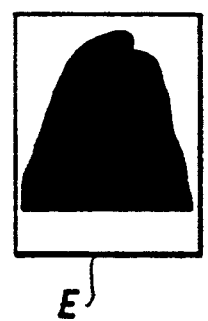
Figure 5C:
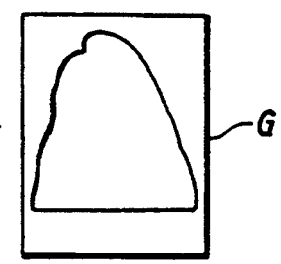
Figure 6:
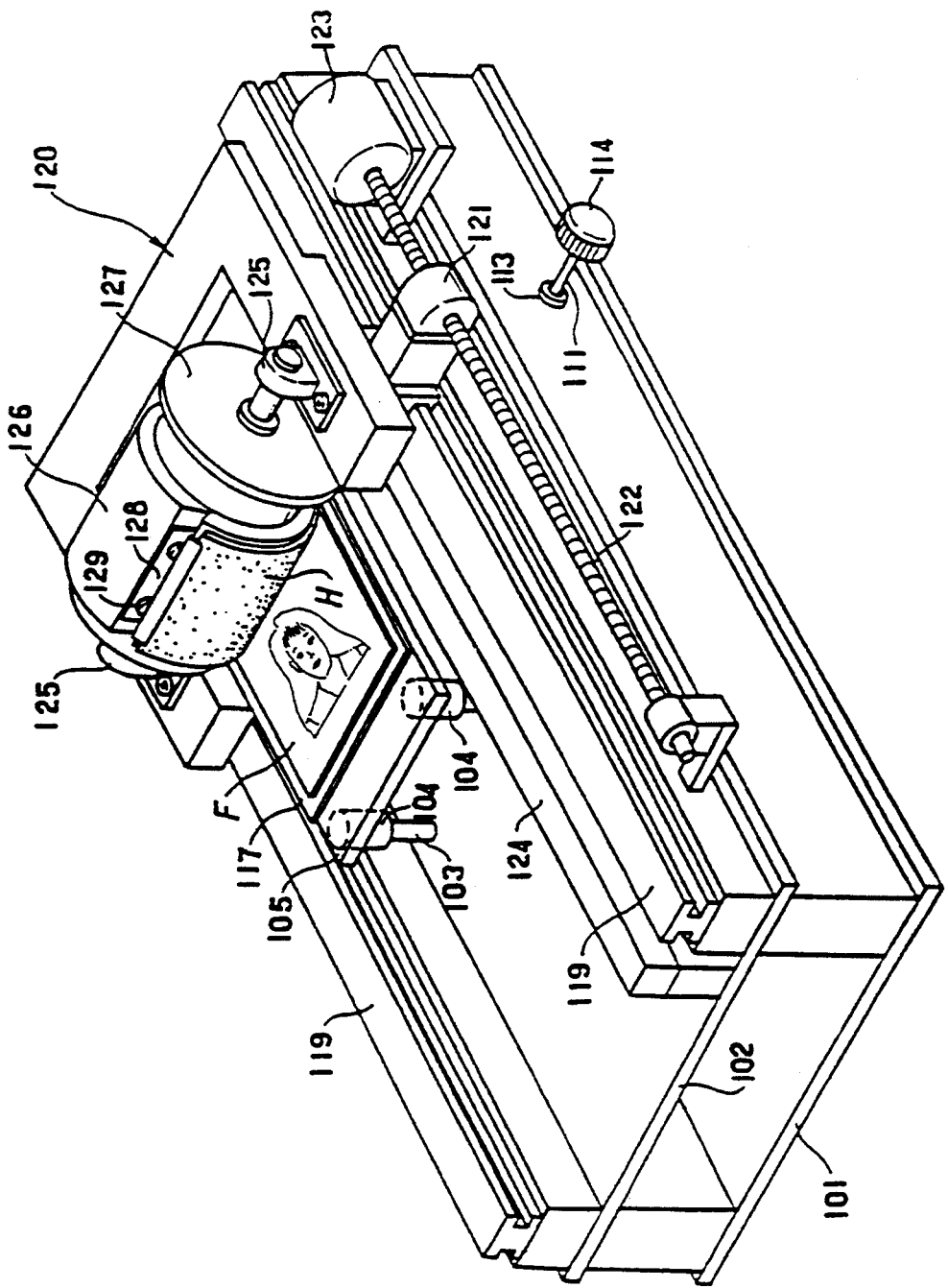
FIG. 6 is a perspective view of a print plate manufacturing device.
Figure 7:
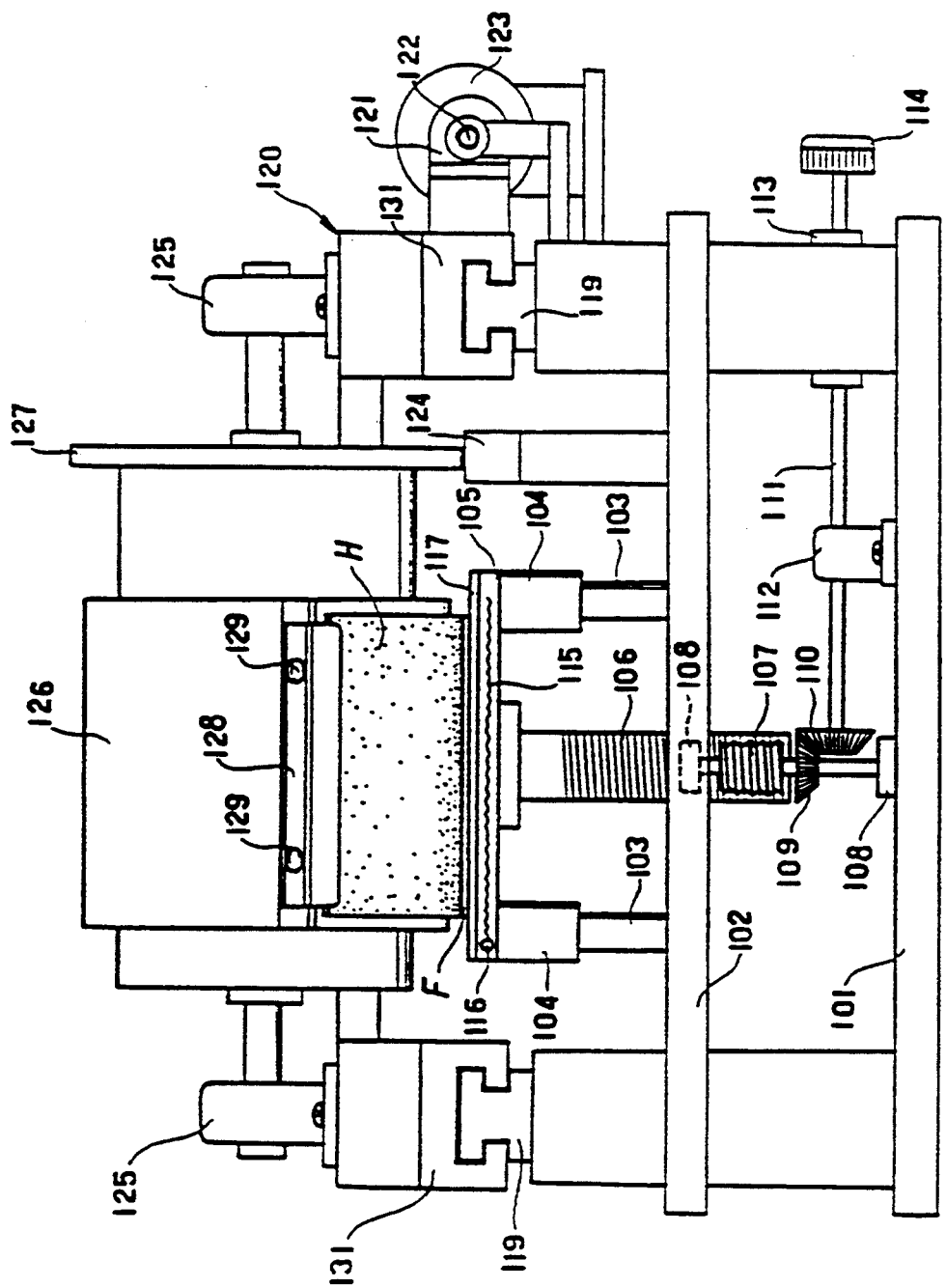
FIG. 7 is a vertical section view of FIG. 6.

Also, where the name is to be described below the portrait as shown in FIG. 4(j), the letter I is reversed and displayed as shown in FIG. 5(a) on the folded transparent film C as shown in FIG. 4(e), and this film is printed on the negative film whereby the silhouette film E in which the cut out portion of the cut out photograph B and the letter I are black as shown in FIG. 5(b) is prepared, and the silhouette film E is reversed and is exposed to light to the photosensitive resin plate, and the silhouette resin plate G as shown in FIG. 5(c) is produced, and in case the foaming resin plate H is produced from the resin plate G by using the foregoing device, the display with the name can be simply stamped.

Accordingly, when the print surface projecting from the edge of the opening of the case is depressed to the required portion of the paper surface by the stamping operation, the elastic mat is contracted, and retreats to the edge of the opening so that the edge of the opening is urged against the paper surface. The print surface is always urged against the paper surface softly with the uniform pressure by the resiliency of the elastic mat.

Also, when the photographic resin plate contacts the surface of the foaming resin plate in uniformly heated condition by a cylinder press whereby the convex portion of the photographic resin plate hot seals the foaming resin plate precisely, and the delicate display such as the halftone becomes possible by the printing plate. Also, the background may be finished by causing it to contact with the silhouette resin plate.

What is claimed is:

1. The method which comprises the steps of
   (1) producing a halftone dot photograph (A) showing shading with the sizes of halftone dots,
   (2) cutting out a desired portion (B) of the halftone dot photograph produced according to step (1), to thereby produce a cut out photograph (B),
   (3) adhering the cutout desired photograph portion (B) resulting from step (2) to the surface of a transparent film (C),
   (4) printing the front side of the product of step (3) on a positive film to thereby produce a halftone positive film (D),
   (5) printing the reverse side of the product of step (3) on a negative film to produce a silhouette film (E) in which said cut out desired portion appears as deep-black,
   (6) superimposing said halftone positive film (D) resulting from step (4) on a photosensitive resin plate and exposing it to light to produce a photographic resin plate (F) in which the transparent portion of the halftone positive film (D) becomes the raised portion,
   (7) turning over said silhouette film (E) and superposing it on the photosensitive resin plate and exposing it to light to thereby produce a silhouette resin plate (G) in which its transparent portion becomes the raised portion,
   (8) said photosensitive resin plates being produced in such a way that a photosensitive resin is formed on a metal plate to a desired thickness,
   (9) alternately bringing said photographic resin plate (F) and said silhouette resin plate (G) into contact with a continuous foaming resin plate (H) under heated conditions to thereby effect at least partial sealing of those portions of the continuous foaming sheet (H) that do not correspond to said desired portion (B) of the halftone dot photograph and to thereby leave the remaining portion of said continuous foaming resin plate (H) receptive to the permeation of ink.

* * * * *